United States Patent [19]

Matsuoka et al.

[11] Patent Number: 4,745,422
[45] Date of Patent: May 17, 1988

[54] AUTOMATIC DEVELOPING APPARATUS

[75] Inventors: Yasuo Matsuoka, Kawasaki; Kinya Usuda, Yokohama; Michiro Takano, Kawasaki, all of Japan

[73] Assignee: Kabushiki Kaisha Toshiba, Kawasaki, Japan

[21] Appl. No.: 930,925

[22] Filed: Nov. 17, 1986

[30] Foreign Application Priority Data

Nov. 18, 1985 [JP] Japan .................................. 60-257953
Nov. 18, 1985 [JP] Japan .................................. 60-257954

[51] Int. Cl.$^4$ .............................................. G03D 3/02
[52] U.S. Cl. .................................. 354/299; 354/324; 354/325; 354/330; 134/153
[58] Field of Search ............... 354/299, 317, 324, 325, 354/329, 330; 134/151, 153, 198, 199, 200, 149, 140

[56] References Cited

U.S. PATENT DOCUMENTS

| | | | |
|---|---|---|---|
| 3,401,705 | 9/1968 | Goldware | 134/151 |
| 3,727,620 | 4/1973 | Orr | 134/140 |
| 3,769,992 | 11/1973 | Wallestad | 134/153 |
| 3,990,462 | 11/1976 | Elftmann et al. | 134/200 |
| 4,092,176 | 5/1978 | Kozai et al. | 134/199 |
| 4,161,356 | 7/1979 | Giffin et al. | 134/149 |
| 4,197,000 | 4/1980 | Blackwood | 134/153 |
| 4,429,983 | 2/1984 | Cortellino et al. | 354/330 |

FOREIGN PATENT DOCUMENTS 57-166032A 4/1981 Japan .................................. 354/325
2154434A 9/1985 United Kingdom ................ 134/153

OTHER PUBLICATIONS

Japanese Patent Application No. 60-93139 Corresponding to U.S. Ser. No. 06/851,206 filed Apr. 14, 1986, entitled "Automatic Developing Device".

Primary Examiner—A. A. Mathews
Attorney, Agent, or Firm—Finnegan, Henderson, Farabow, Garrett & Dunner

[57] ABSTRACT

An automatic developing apparatus comprises a developing tank and a pipe for introducing a developing solution into the developing tank. The developing tank is constituted by a stage on which a substrate is to be set, and a processing case movable relative to the stage, to receive said stage.

21 Claims, 6 Drawing Sheets

F I G. 5
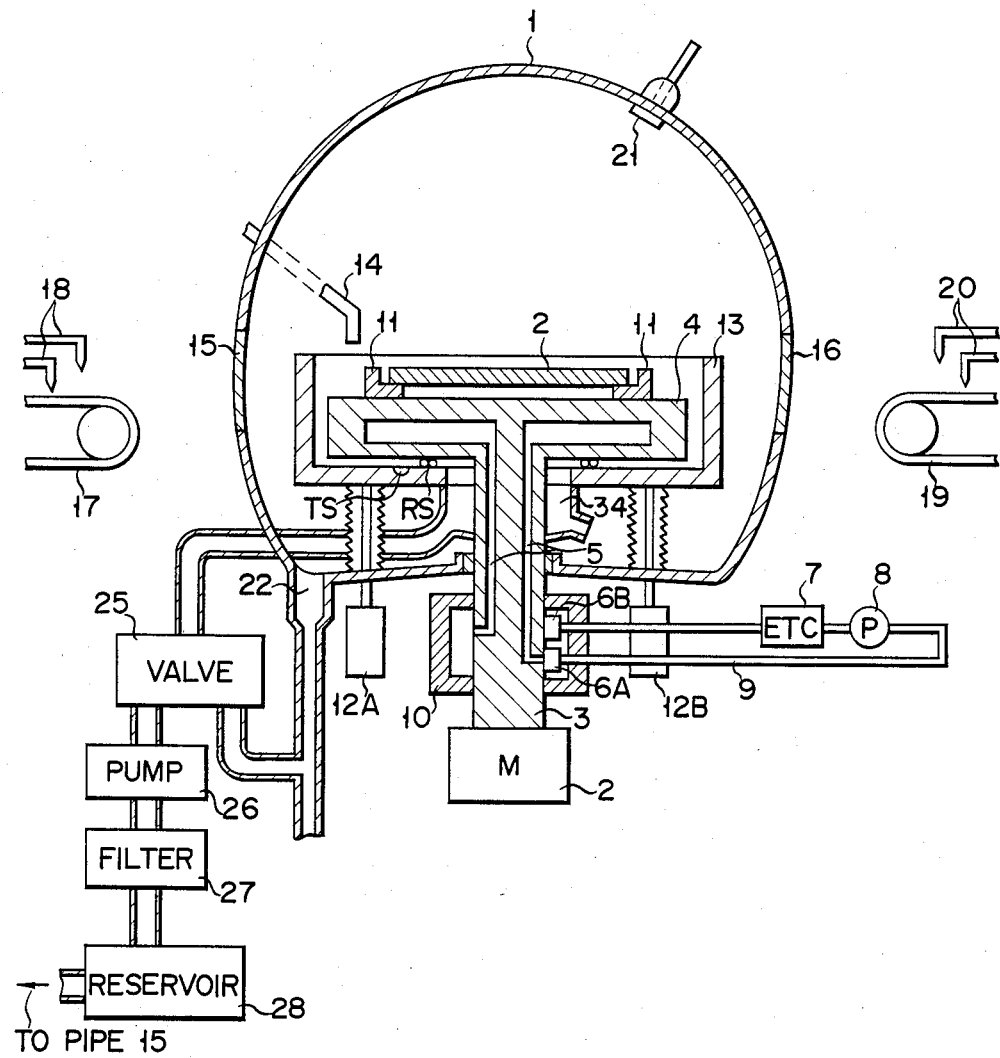

AUTOMATIC DEVELOPING APPARATUS

BACKGROUND OF THE INVENTION

This invention relates to an automatic developing apparatus which carries out the precise development of a resist deposited on a semiconductor substrate to be processed.

The formation of a resist pattern on a photomask or semiconductor wafer is generally performed by the lithographic process. The lithographic process comprises the steps of applying a resist material to the surface of a substrate to be processed, drawing an image, by means of selective impingement of electromagnetic rays such as ultraviolet rays or particulate rays, for example, electronic rays, on the resist, and developing the resultant patterned resist.

This development method is basically classified into three types:
  Dipping process
  Spray process
  Paddle process The dipping process consists in dipping an object substrate, coated with a resist, in a developing solution. This process has the merits in that only a small amount of developing solution needs to be used; the temperature of the developing solution is easy to control; and a resulting resist pattern exhibits relatively small dimensional variations. However, the most noticeable drawbacks of the dipping process are that when development is carried out continuously, to process a plurality of substrates, floating foreign particles noticeably appear in the developing solution; the settling of these foreign particles tends to give rise to defects in the resist pattern, interconnection breakages, or short-circuiting, thereby presenting difficulties in the formation of a predetermined resist pattern; the subject-developing process is lowered in operability and presents difficulties with regard to automation; further, while the processed substrate is moved out after development of the resist pattern, the undesirable dissolution of the finished resist pattern is advanced by the developing solution adhering thereto; it is therefore impossible to fully meet the present-day demand for a higher-precision resist pattern.

The spray process consists in spraying a clear developing solution on a resist formed on the substrate. The spray process offers the advantages in that the developing step can be easily automated; since a clear developing solution is always applied, a finished resist pattern is less subject to defects. But the spray process is accompanied with the drawbacks in that the temperature of the developing solution is difficult to control; since differences appear in the temperature of the developing solution applied to the surface of the substrate, due to the effect of vaporization heat, the finished resist pattern tends to undergo dimensional variations.

The paddle process comprises the steps of keeping an object substrate, coated with a resist, in a resting state, or in a slowly rotating state, and forming a film of a developing solution over the resist, by means of dripping. The paddle process is an intermediate method between the spray process and the dipping process. Namely, the paddle process offers the advantages in that the consumption of developing solution is low, as in the case of the dipping process and that automation is easily realized. Still, the paddle process is accompanied with the drawbacks in that the temperature of the developing solution is difficult to control, as in the case of the spray process; and dimensional variations in the resulting resist pattern tend to be noticeable.

SUMMARY OF THE INVENTION

This invention has been devised in view of the above-mentioned circumstances, and is intended to provide an automatic developing apparatus which is capable of forming a resist pattern with a high precision and of reliably performing development of the resist.

To attain the above-mentioned object, the present invention provides an automatic developing apparatus comprising a stage for carrying a substrate, a processing case which is movable relative to the stage and which constitutes a developing tank together with the stage, and a pipe through which a developing solution is supplied to the developing tank.

The present invention is characterized in that upon completion of development, the stage and processing case are moved relative each other, thereby enabling the substrate to be immediately taken out of the developing solution; the developing time can be controlled with an appreciably high precision; the developing solution can be drawn out as soon as the developing process is brought to an end; development can always be performed with a clear developing solution; and the defects which might otherwise appear in the resist pattern can be reduced in number.

BRIEF DESCRIPTION OF THE DRAWINGS

FIGS. 5 to 7 show an automatic developing apparatus according to other embodiments of the invention.

DETAILED DESCRIPTION OF THE PREFERRED EMBODIMENTS

Figure 1:
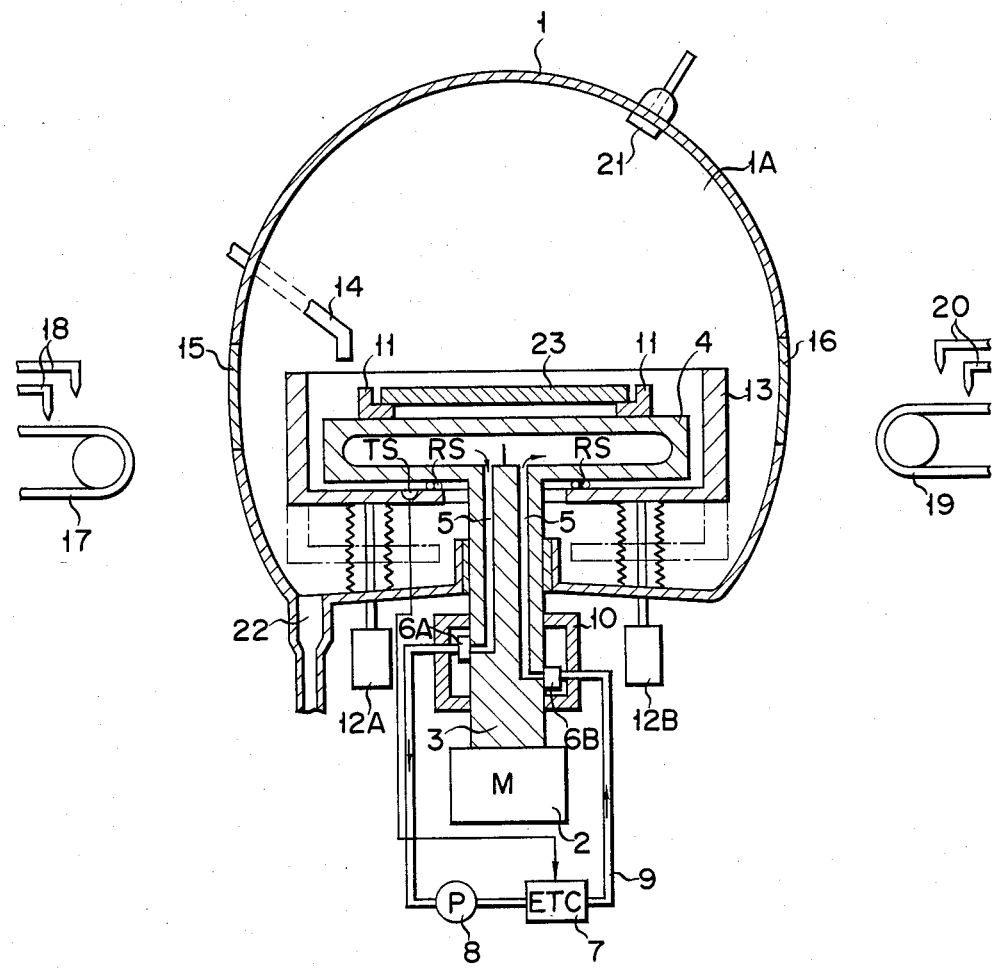
FIG. 1 sets forth an automatic developing apparatus according to a first embodiment of this invention.

FIG. 1 is a sectional view of an automatic developing apparatus according to a first embodiment of this invention. This developing apparatus has housing 1 prepared from fluorine resin, for example, Teflon, which is capable of hermetically sealing processing chamber 1A. Motor 2 is set below housing 1. Rotary shaft 3, turned by motor 2, is inserted into processing chamber 1A through the center of the bottom wall of housing 1. Substrate stage 4 is mounted on that portion of rotary shaft 3 which is inserted into processing chamber 1A. Passage 5 for constantly-heated water runs through rotary shaft 3 and substrate stage 4. Passage 5 is opened on the side wall of that portion of rotary shaft 3 which extends outside of processing chamber 1. The openings are provided with fittings 6A, 6B. Fittings 6A, 6B are connected to pipe 9 which is provided with intervening electronic thermostatic chamber 7 and pump 8, thereby enabling constantly-heated water (held, for example, at 20° to 25° C.) to be supplied to the interior of rotary shaft 3 and substrate stage 4. The opening of passage 5 for constantly-heated water is covered by annular groove 10 which is hermetically mounted on shaft 3.

Pawls 11 are provided on substrate stage 4. Cylinders 12A, 12B are set below housing 1. Vertically movable processing case 13 for holding substrate stage 4 is fitted to the upper ends of cylinders 12A, 12B. When processing case 13 is lifted, a free space between the upper plane of the bottom wall of case 13 and the lower plane of the bottom wall of substrate stage 4 is sealed in a liquid-tight state by ring seal RS. Thus, processing case 13 and substrate stage 4 jointly constitute a developing tank. Processing case 13 is provided with an opening at the center. When processing case 13 is lowered fully remotely from substrate stage 4, the liquid held in processing case 13 is drawn out of chamber 1A through the opening. A developing solution is supplied through feeding pipe 14, penetrating housing 1, into the developing tank constituted by substrate stage 4 and processing case 13.

Substrate inlet port 15 and substrate outlet port 16 are provided on the side walls of housing 1. Provided near the outside of substrate inlet port 15 are conveyor 17 and arms 18 which carry the substrate from conveyor 17 into processing chamber 1A. The substrate to be carried into processing chamber 1A is formed by depositing chromium on a glass plate, applying a resist, pre-baking, and drawing an image, by use of electronic rays. Provided near the outside of substrate outlet port 16 are conveyor 19 for transporting the substrate to the succeeding step, and arms 20 for drawing the substrate out of processing chamber 1A onto conveyor 19.

Nozzle 21, through which a rinsing liquid is sprayed, is provided on the upper wall of housing 1. A developing solution and rinsing liquid are drawn out of processing chamber 1A through liquid discharge port 22 formed at the bottom of housing 1. Liquid discharge port 22 may also be used as a port for drawing a gaseous atmosphere out of processing chamber 1A.

The process of developing a resist pattern formed on the substrate by the subject developing apparatus is performed according to the following steps:

First, cylinders 12A, 12B are operated to lift processing case 13, thereby carrying out the liquid-tight sealing of a space defined between the upper plane of the bottom wall of processing case 13 and the underside of substrate stage 4, thereby providing a developing tank. Later, a developing solution held at the predetermined temperature is drawn into the developing tank constituted by substrate stage 4 and processing case 13. Then, substrate inlet port 15 is opened by, for example, a pen cylinder (not shown). Thereafter, substrate 23 is picked up from conveyor 20 by transport arms 18 and is placed on substrate catch pawls 11. At this time, the developing process has commenced. During the developing process, temperature sensor TS which is formed of, for example, a thermocouple, is dipped in the developing solution. In case the temperature of the developing solution deviates from the predetermined level, a control signal issued from temperature sensor TS, indicating the current temperature of the developing solution, is fed back to electronic thermostatic chamber 7, thereby regulating the temperature of the water supplied to pipe 9, and controlling the temperature of the developing solution. After developing has proceeded for a predetermined period of time, cylinders 12A, 12B are actuated to bring down processing case 13, to draw the developing solution out through discharge port 22, thus terminating the developing process. Later, motor 2 is driven at a speed of, for example, 200 to 500 rpm, and a rinsing liquid is sprayed through nozzle 21, to perform the rinsing operation. Further, substrate stage 4 is rotated at about 2000 rpm, to dry substrate 23. Thereafter, substrate 23 is removed from substrate catch pawls 11 by means of transport arms 20, is carried out of processing chamber 1A, and is set on conveyor 19, to be forwarded to the succeeding step.

The above-mentioned automatic developing apparatus embodying this invention can automate the dipping process, through the steps of constructing a developing tank by the lifting of processing case 13, inserting substrate 23, feeding in a developing solution, discharging the developing solution by the descent of processing case 13, and releasing substrate 23. The automatic developing apparatus of the invention has the merits in that the temperature of the developing solution, when applied, can be precisely controlled by drawing upon the advantage of the dipping process, i.e. the easy control of the temperature of the developing solution during the developing operation. The temperature of the developing solution can be controlled more precisely by adjusting the temperature of substrate stage 4 constituting the developing tank. Further, the automatic developing apparatus of the present invention offers the advantages in that since the developing process is performed with high precision and a clear developing solution is applied for each developing process, it is possible to suppress the occurrence of defects in the resist pattern; since the spraying of a rinsing solution through nozzle 21, after the completion of the developing process, can quickly clean the surface of the substrate subjected to the developing process, the resist pattern can be substantially prevented from being dissolved, thereby improving the precision of development.

Figure 2:
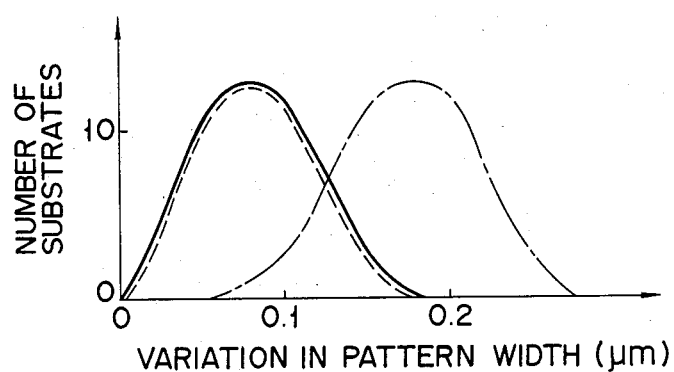
FIGS. 2 and 3 show a comparison between the developing properties of the developing apparatus of FIG. 1, embodying the invention, and those of the conventional dipping and spray types of development.

FIG. 2 illustrates the relationship between the rate of variations occurring in the width of a resist pattern and the number of substrates undergoing a satisfactory developing process. The data were obtained when comparison was made between the developing process (a solid line) performed by the automatic developing apparatus of FIG. 1, embodying the present invention, and the developing operations based on the conventional dipping process (a broken line) and the spray process (a one dot-dash line). In this experiment, the resist pattern had a width of 2 microns. The solid line of FIG. 2 clearly proves that the automatic developing apparatus of FIG. 1, embodying the present invention, can perform developing with a far higher precision than the conventional spray type developing process represented by the one dot-dash line, and with substantially as high a precision as the conventional dipping process, denoted by the broken line.

Figure 3:
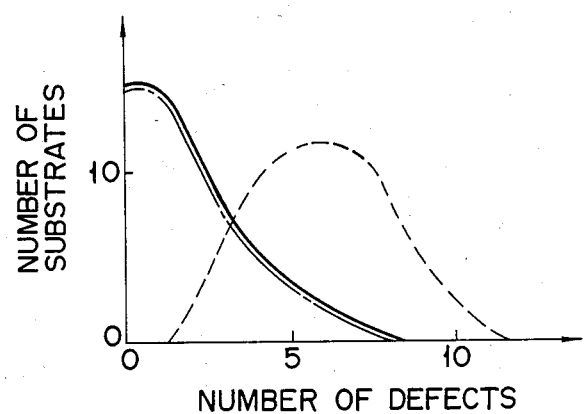

FIG. 3 shows the relationship between the rate of defects occurring in a square area, wherein each side measured, for example, 105 mm, and the number of substrates subjected to the developing process. Data were obtained by comparing the case where a resist pattern was formed by the automatic developing apparatus of FIG. 1, embodying this invention (represented by a solid line), with the cases where a resist pattern was formed by the conventional dipping process (indicated by a broken line), and where also a resist pattern was formed by the conventional spray type developing process (denoted by a one dot-dash line). FIG. 3 distinctly proves that the automatic developing process of FIG. 1, embodying the present invention (represented by a solid line), results in less developing defects than the conventional dipping process (indicated by a broken line), and produces substantially as few developing defects as the conventional spray type developing process (denoted by a one dot-dash line).

The aforementioned example of the present invention refers to the case where the temperature of the developing solution, when actually applied, was controlled by letting the streams of constantly-heated water flow through substrate stage 4. It is obviously possible to allow the constantly-heated water streams to run through the body of processing case 13. Further, a liquid used for temperature control in the aforementioned development process need not be limited to water, but may be a hot solvent such as glycerine or a gas. Further, the foregoing example of the present invention represents the case where temperature sensor TS was dipped in a developing solution, and temperature control was effected by feeding a control signal issued from temperature sensor TS, which indicated the current temperature of the developing solution, back to electronic thermostatic chamber 7. In this case, it is possible to monitor the temperature of the developing solution, by means of temperature sensor TS, and integrate a temperature signal obtained as the result of the monitoring, thereby compensating for the time of development.

Figure 4:
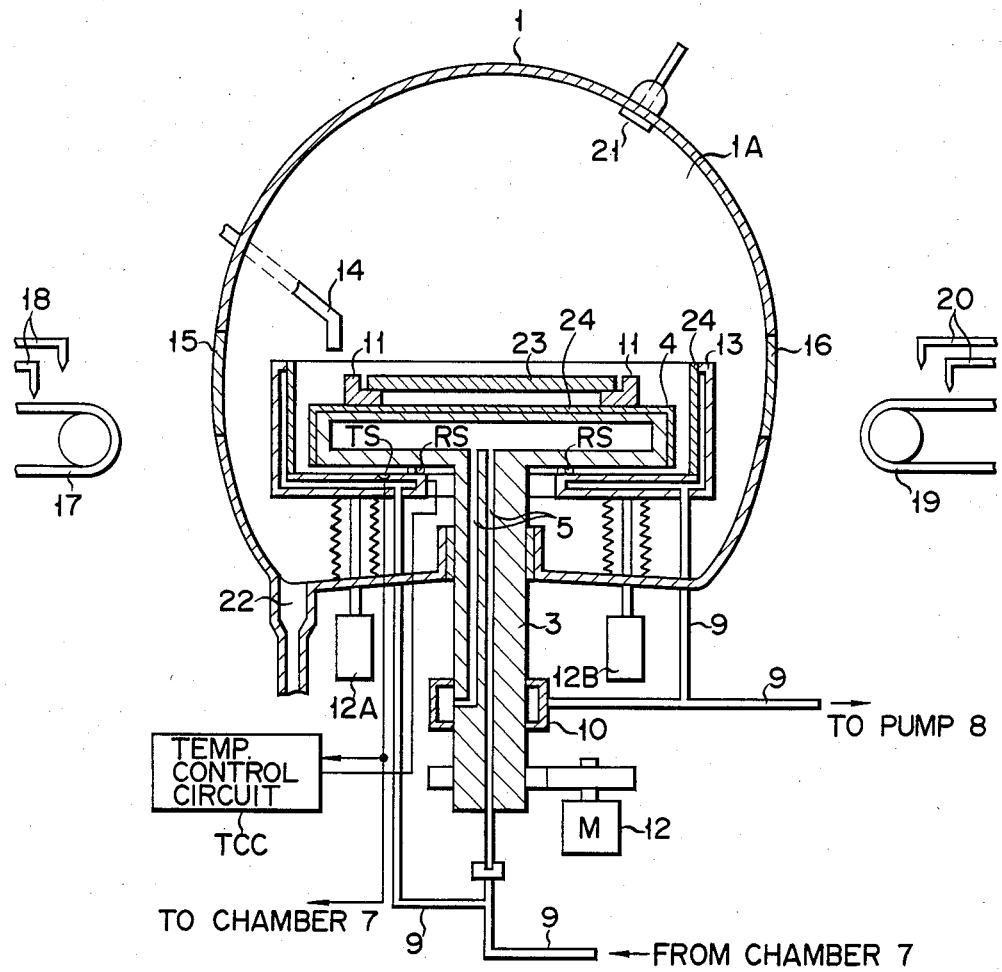
FIG. 4 indicates an automatic developing apparatus according to a second embodiment of the invention which has a function for directly controlling the temperature of the developing solution.

Modification of the automatic developing apparatus embodying the present invention will now be described with reference to FIG. 4. In this case, heating plate 24 composed of, for example, a Pt resistor, is set on that plane of substrate stage 4 and that plane of processing case 13 which will come into contact with the developing solution. In this case, heating plate 24 is positioned on the inside of processing case 13, with a slight space therebetween. The temperature of heating plate 24 is controlled by temperature control circuit TCC in accordance with a temperature signal supplied from temperature sensor TS, thereby directly controlling the temperature of the developing solution. In this case, it is preferable, for the sake of improving the efficiency of heating plate 24, to let cool air streams flow through a space defined between heating plate 24 and processing case 13, via pipe 9 and circulation port 5.

An automatic developing apparatus according to a third embodiment of the present invention will now be described with reference to FIG. 5. This third embodiment, shown in FIG. 5, has substantially the same function as the first embodiment of FIG. 1, except that solution collector 34 is so formed as to communicate with an opening provided at the center of the bottom plate of processing case 13, valve 25, pump 26, filter 27, and reservoir 28. The third embodiment of the present invention is characterized in that when processing case 13 is brought downward after the completion of the developing process, the developing solution held in processing case 13 flows into solution collector 34 and is then drawn out by pump 26, to be carried into reservoir 28 via valve 25, occupying a first position, and filter 27. Since the developing solution held in processing case 13 is drawn out immediately, a rinsing liquid is quickly sprayed through nozzle 21, for the commencement of the rinsing operation. In this case, valve 25 is set in a second position. The used rinsing liquid, running into liquid collector 34, is discharged outward through valve 25.

In this third embodiment, the substrate is rinsed, as soon as the developing process is brought to an end, thus preventing the resist pattern from being excessively dissolved, thereby elevating the developing precision. Further, the used developing solution can be applied once more, by means of a purification process.

Figure 6:
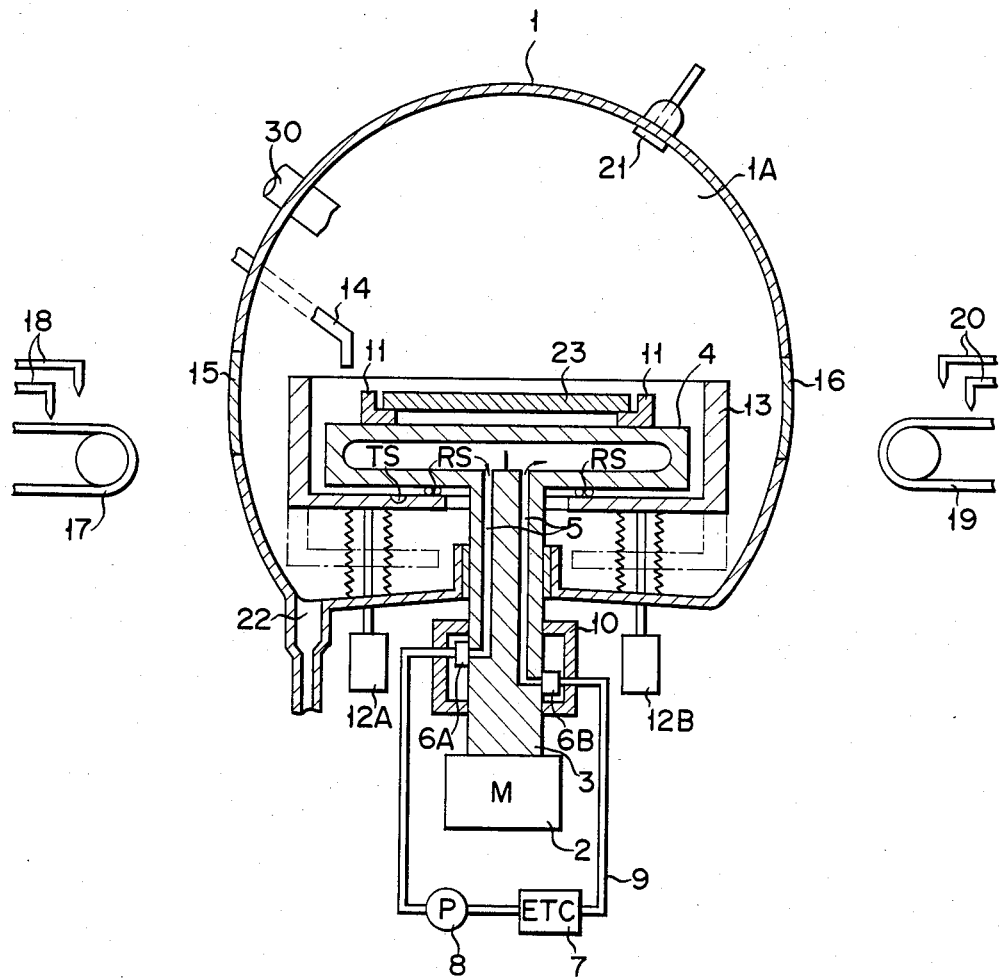

A developing apparaus according to a fourth embodiment of the invention will now be described with reference to FIG. 6. This fourth embodiment has substantially the same function as the first embodiment of FIG. 1, except for a gas feeder 30. An inert gas, for example, nitrogen gas, whose temperature has already been controlled, is introduced from the outside, into processing chamber 1A, and is later discharged outward through exhaust port 22 or another port, formed somewhere else. Thus, the temperature of the developing solution can be rigidly controlled by adjusting the interior temperature of processing chamber 1A. During the developing process, however, it is advisable to stop the discharging of the inert gas for the purpose of suppressing the evaporation of the developing solution. Throughout the description of third and fourth embodiments, a wiring connected thermocouple, namely, temperature sensor TS is omitted for the simplification of drawing.

An automatic developing apparatus representing the present invention has been described with reference to the foregoing embodiments. However, the invention is not limited thereto. Throughout the descriptions of the embodiments, the substrate was mounted on stage 4 after the developing tank was filled with a developing solution. However, the substrate may be placed on substrate 4 before a developing solution is supplied thereinto.

Figure 7:
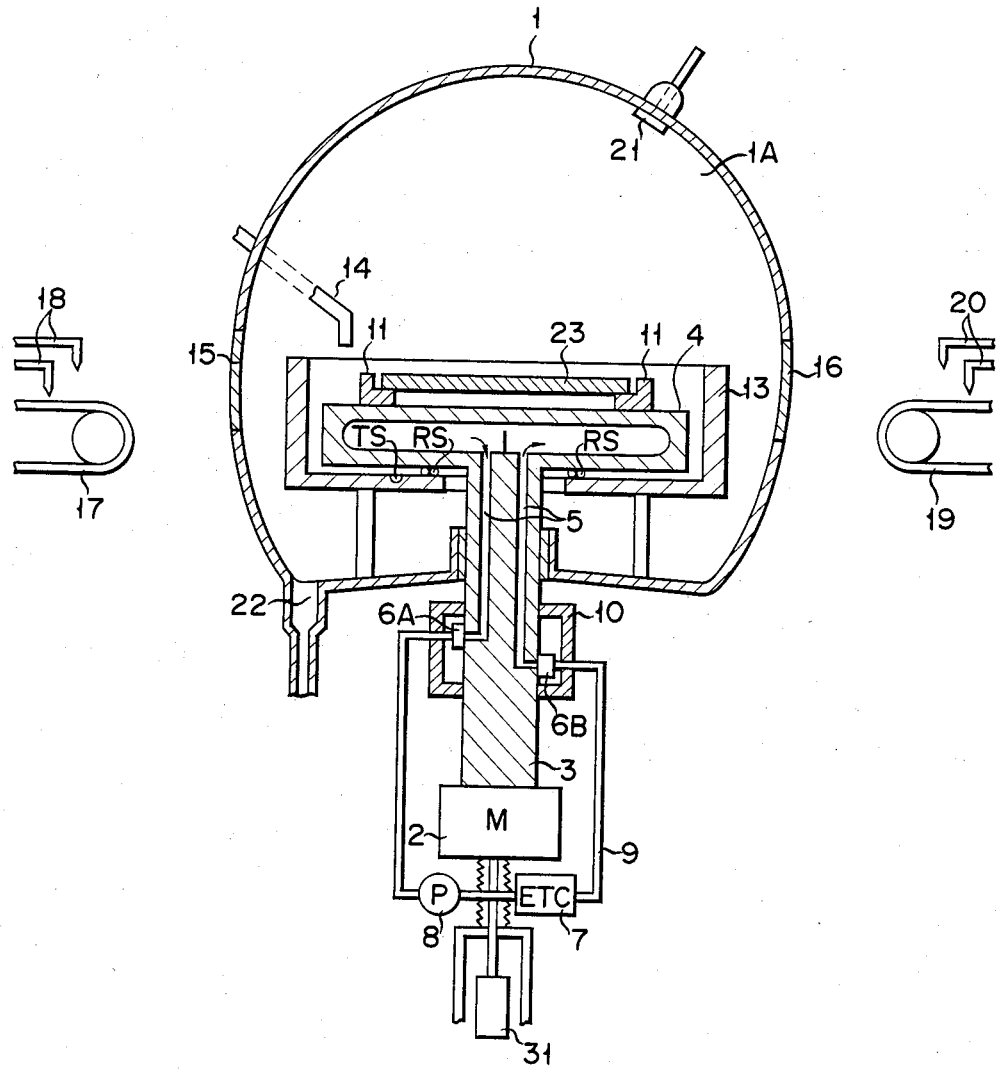

Further, throughout the descriptions of the aforementioned embodiments, stage 4 was fixed and processing case 13 was made vertically movable. As is shown in FIG. 7, however, it is possible to omit cylinders 12A, 12B, fix processing case 13 and instead provide cylinder 31 for the vertical movement of shaft 3, and render stage 4 vertically movable relative to processing case 13.

Further, it is possible to adopt the spray type developing process, by spraying a developing solution through rinsing nozzle 21. As has been mentioned above, developing rinsing, and drying can be performed automatically as well as continuously, with the substrate being held on stage 4, thereby enabling the complete developing apparatus to be rendered compact.

What is claimed is:

1. An automatic developing apparatus comprising:
   a stage on which a substrate is to be set;
   a processing case which is moved relative to said stage to receive said stage, and which has a bottom wall and an outlet formed in the bottom wall, said stage being brought into contact with the bottom wall to hermetically close the outlet, thereby constituting a developing tank; and
   means for supplying a developing solution to said developing tank.

2. An automatic developing apparatus according to claim 1, which further comprises rotation means coupled to said stage, for the rotation of the same.

3. An automatic developing apparatus according to claim 2, which further comprises drive means for vertically driving one of said processing case and stage.

4. An automatic developing apparatus according to claim 2, wherein said rotation means comprises a shaft connected to said stage, and a motor for imparting a rotational movement to said shaft.

5. An automatic developing apparatus according to claim 4, which further comprises discharging means connected to the outlet port of said processing case, to draw out a fluid therefrom.

6. An automatic developing apparatus according to claim 4, wherein a fluid passage is formed in said stage and shaft, and is provided with temperature-controlled fluid-supply means.

7. An automatic developing apparatus according to claim 6, wherein temperature-sensing means is provided to detect the temperature of a liquid held in said developing tank; and said temperature-controlled fluid-supply means enables said fluid passage to receive the fluid whose temperature corresponds to a control signal from said temperature-sensing means.

8. An automatic developing apparatus according to claim 7, further comprises a nozzle for spraying a rinsing liquid over said stage.

9. An automatic developing apparatus according to claim 7, which further comprises a housing surrounding the stage and processing case, and means for introducing an inert gas into said housing, in order to control the temperature prevailing therein.

10. An automatic developing apparatus according to claim 3, which further comprises a nozzle through which a rinsing liquid is sprayed over said stage.

11. An automatic developing apparatus according to claim 3, which further comprises a housing surrounding said stage and processing case, and inert-gas feeding means for introducing an inert gas into said housing, in order to control the temperture prevailing therein.

12. An automatic developing apparatus according to claim 3, wherein said processing case comprises an outlet which, after said processing case is separated from said stage after completion of a developing process allows for discharging a developing solution held in said processing case.

13. An automatic developing apparatus according to claim 2, which further comprises a nozzle through which a rinsing liquid is sprayed over said stage.

14. An automatic developing apparatus according to claim 2, which further comprises a housing surrounding said stage and processing case, and inert gasfeeding means for introducing an inert gas into said housing, in order to control a temperature prevailing therein.

15. An automatic developing apparatus according to claim 2, wherein said processing case comprises an outlet which, after completion of a developing process, allows for discharging a developing solution held in said processing case.

16. An automatic developing apparatus according to claim 1, wherein there is further provided a nozzle through which a rinsing liquid is sprayed over said stage.

17. An automatic developing apparatus according to claim 1, which further comprises a housing surrounding said stage and processing case, and inert gas-feeding means for introducing an inert gas into said housing, in order to control a temperature prevailing therein.

18. An automatic developing apparatus according to claim 1, which further comprises drive means for vertically driving one of said stage and processing case.

19. An automatic developing apparatus according to claim 1, wherein said processing case comprises an outlet which, after said processing case is removed from said stage after completion of a developing process, allows for discharging a developing solution held in said processing case.

20. An automatic developing apparatus according to claim 2, which further comprises a heating element fitted inside said developing tank.

21. An automatic developing apparatus according to claim 20, wherein said heating element comprises a heating plate held inside said developing tank, with a space allowed between said heating plate and processing case.

* * * * *